(12) United States Patent
Hong et al.

(10) Patent No.: US 11,114,358 B2
(45) Date of Patent: Sep. 7, 2021

(54) SEMI-CONDUCTOR PACKAGE

(71) Applicant: Samsung Electro-Mechanics Co., Ltd., Suwon-si (KR)

(72) Inventors: Suk Youn Hong, Suwon-si (KR); Han Su Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/776,809

(22) Filed: Jan. 30, 2020

(65) Prior Publication Data

US 2021/0057299 A1    Feb. 25, 2021

(30) Foreign Application Priority Data

Aug. 21, 2019 (KR) ......................... 10-2019-0102283

(51) Int. Cl.
*H01L 23/31* (2006.01)
*H01L 23/00* (2006.01)

(52) U.S. Cl.
CPC ............ *H01L 23/31* (2013.01); *H01L 23/564* (2013.01)

(58) Field of Classification Search
CPC .............................. H01L 23/31; H01L 23/564
See application file for complete search history.

(56) References Cited

U.S. PATENT DOCUMENTS

| 7,999,368 | B2 * | 8/2011 | Yim | H01L 25/0655 |
| | | | | 257/686 |
| 8,399,300 | B2 * | 3/2013 | Lee | H01L 23/49811 |
| | | | | 438/118 |
| 10,438,863 | B1 * | 10/2019 | Boja | H01L 24/32 |
| 2008/0179738 | A1 * | 7/2008 | Nishimura | H01L 24/29 |
| | | | | 257/737 |
| 2011/0115083 | A1 * | 5/2011 | Zang | H01L 21/563 |
| | | | | 257/738 |
| 2014/0327138 | A1 * | 11/2014 | Miyamoto | H01L 23/04 |
| | | | | 257/738 |
| 2019/0103682 | A1 * | 4/2019 | Thai | H01Q 1/38 |

FOREIGN PATENT DOCUMENTS

| JP | 1999-059040 A | 3/1999 |
| JP | 2009-188086 A | 8/2009 |
| KR | 10-0938408 B1 | 1/2010 |

* cited by examiner

*Primary Examiner* — Peniel M Gumedzoe
(74) *Attorney, Agent, or Firm* — NSIP Law

(57) ABSTRACT

A semiconductor package includes a substrate, a plurality of electronic components mounted on a first surface of the substrate, and an encapsulant disposed on the first surface of the substrate so that at least one of the plurality of electronic components is embedded in the encapsulant. The substrate includes a flow preventing portion including at least one flow preventing groove disposed in the first surface and adjacent to the encapsulant and/or at least one dam disposed on the first surface and adjacent to the encapsulant.

19 Claims, 9 Drawing Sheets

SEMI-CONDUCTOR PACKAGE

CROSS-REFERENCE TO RELATED APPLICATION(S)

This application claims the benefit under 35 USC 119(a) of Korean Patent Application No. 10-2019-0102283 filed on Aug. 21, 2019 in the Korean Intellectual Property Office, the entire disclosure of which is incorporated herein by reference for all purposes.

BACKGROUND

1. Field

The following description relates to a semiconductor package.

2. Description of Background

In the case of a semiconductor package in which an antenna pattern is formed on a substrate, some of the plurality of electronic components mounted on the substrate are sealed by an encapsulant, while some of the plurality of electronic components are not sealed by the encapsulant, but instead are mounted on a substrate while being exposed externally.

However, at a boundary between a portion molded by an encapsulant and a portion not molded by an encapsulant, a problem may occur, in which an encapsulant flows to contaminate a substrate or a connection pad formed in a substrate is covered by an encapsulant.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A semiconductor package capable of preventing a substrate from being contaminated by an encapsulant, and preventing an encapsulant from covering a connection pad provided in a substrate.

In one general aspect, a semiconductor package includes a substrate, a plurality of electronic components mounted on a first surface of the substrate, and an encapsulant disposed on the first surface of the substrate so that at least one of the plurality of electronic components is embedded in the encapsulant. The substrate includes a flow preventing portion including at least one flow preventing groove disposed in the first surface and adjacent to the encapsulant and/or at least one dam disposed on the first surface and adjacent to the encapsulant.

A width of the at least one flow preventing groove may be 80 µm to 100 µm, a depth of the at least one flow preventing groove may be 20 µm to 30 µm, a width of the at least one dam may be 80 µm to 100 µm, and a height of the at least one dam may be 20 µm to 30 µm.

The flow preventing portion may include a flow preventing groove disposed adjacent to the encapsulant and a dam spaced apart from and disposed in parallel to the flow preventing groove.

The flow preventing portion may include a first flow preventing groove disposed adjacent to the encapsulant, a second flow preventing groove spaced apart from the first flow preventing groove, and a dam disposed between the first flow preventing groove and the second flow preventing groove.

The flow preventing portion may include a first flow preventing groove disposed adjacent to the encapsulant and a second flow preventing groove spaced apart from and disposed in parallel to the first flow preventing groove.

A depth of the first flow preventing groove may be equal to a depth of the second flow preventing groove.

A depth of the second flow preventing groove may be larger than a depth of the first flow preventing groove.

The flow preventing portion may include a first dam disposed adjacent to the encapsulant and a second dam spaced apart from and disposed in parallel to the first dam.

A height of the first dam may be the same as a height of the second dam.

A height of the second dam may be greater than a height of the first dam.

The semiconductor package may include an antenna disposed on a second surface of the substrate opposite to the first surface.

The antenna may be configured for Wi-Fi communication or 5G communication.

The at least one dam may include an insulating material.

The at least one flow preventing groove or the at least one dam may be spaced apart from the encapsulant by 80 µm to 100 µm.

In another general aspect, a semiconductor package includes a substrate, a plurality of electronic components mounted on a first surface of the substrate, and an encapsulant disposed on the first surface of the substrate so that at least one of the plurality of electronic components is embedded in the encapsulant. The substrate includes a flow preventing portion disposed adjacent to the encapsulant, the flow preventing portion includes at least one of a flow preventing groove disposed in the first surface of the substrate and a dam disposed on the first surface of the substrate, and the flow preventing portion is spaced apart from the encapsulant by 80 µm to 100 µm.

The width of the flow preventing groove may be 80 µm to 100 µm, a depth of the flow preventing groove may be 20 µm to 30 µm, a width of the dam may be 80 µm to 100 µm, and a height of the dam may be 20 µm to 30 µm.

In another general aspect, a semiconductor package includes a substrate; an encapsulant disposed on a first surface of the substrate; a first electronic component mounted on the first surface of the substrate and embedded in the encapsulant; a second electronic component mounted on the first surface of the substrate outside of the encapsulant; a first flow preventing element disposed along the first surface of the substrate between the encapsulant and the second electronic component; and a second flow preventing element disposed along the first surface of the substrate between the first flow preventing element and the second electronic component.

The first flow preventing element may be a groove disposed in the first surface of the substrate, the second flow preventing element may be a dam disposed on the first surface of the substrate, and the groove may be spaced apart from the encapsulant by 80 µm to 100 µm.

The first flow preventing element may be a first groove disposed in the first surface of the substrate, the second flow preventing element may be a second groove disposed in the first surface of the substrate, and the first groove may be spaced apart from the encapsulant by 80 µm to 100 µm.

The first flow preventing element may be a first dam disposed on the first surface of the substrate, the second flow preventing element may be a second dam disposed on the first surface of the substrate, and the first dam may be spaced apart from the encapsulant by 80 μm to 100 μm.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
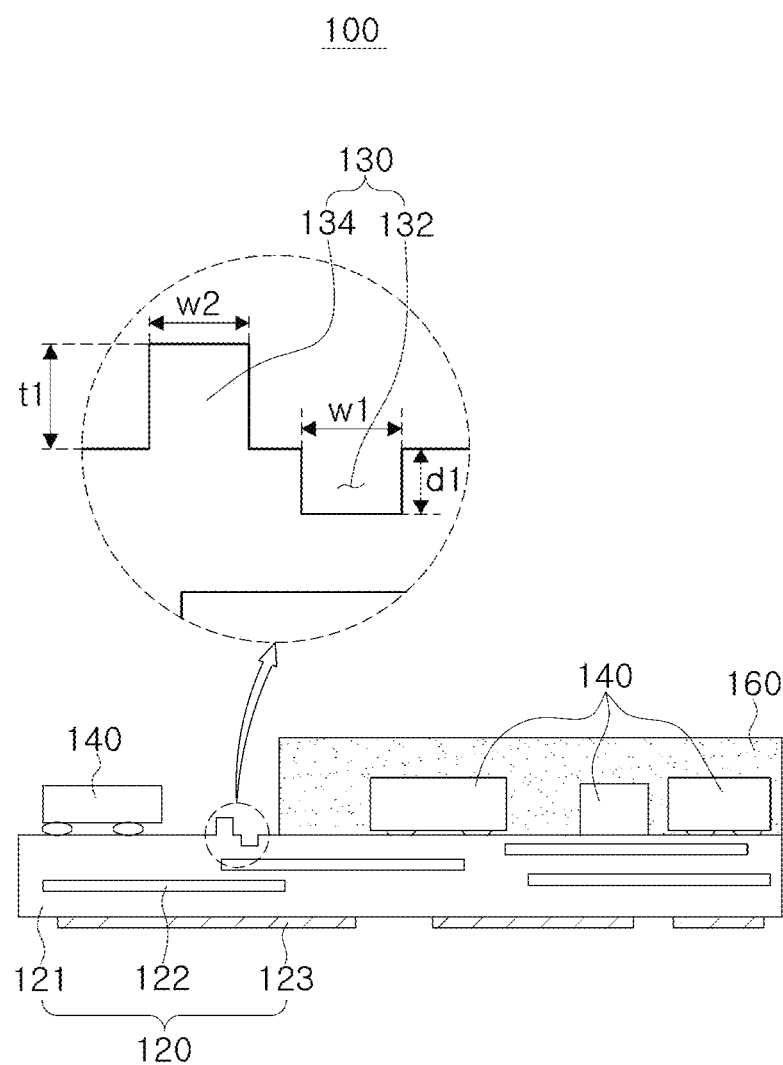
FIG. 1 is a schematic diagram illustrating a semiconductor package according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or wafer (substrate), is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described with reference to the attached drawings.

FIG. 1 is a schematic diagram illustrating a semiconductor package according to a first example.

Referring to FIG. 1, a semiconductor package 100 may include a substrate 120, one or more electronic components 140, and an encapsulant 160.

The substrate 120 has a plate shape, and may include an insulating layer 121 and a wiring layer 122. A material used for the insulating layer 121 may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, an insulating material, such as prepreg, an Ajinomoto build-up film (ABF), FR-3, bismaleimide triazine (BT), or the like. A material used for the wiring layer 122 may be a conductive material such as copper (Cu), aluminum (Al), silver (Ag), tin (Sn), gold (Au), nickel (Ni), lead (Pb), titanium (Ti), or alloys thereof.

As an example, the substrate 120 may be one among a rigid printed circuit board, a flexible printed circuit board, and a rigid-flexible printed circuit board. Moreover, the substrate 120 may be one of a single-layer printed circuit board and a multilayer printed circuit board.

The substrate 120 may be provided with a plurality of external terminals (not shown) connected to the wiring layer 122, and the external terminals may be provided as a solder ball, a conductive bump, a pin grid array, a lead grid array, a copper pillar, or a combination thereof.

A lower surface (opposite surface to the surface on which the electronic component(s) 140 are disposed) of the substrate 120 may be provided with an antenna 123. The antenna 123 may be an antenna for Wi-Fi, an antenna for 5G, or the like, and may be formed by patterning in a lower surface of the substrate 120. The antenna 123 may be provided as a plurality of antennas spaced apart from each other in the lower surface of the substrate 120, and the plurality of antennas 123 may be connected to each other.

An upper surface of the substrate 120, that is, a surface having the electronic component(s) 140 mounted thereon, may be provided with a flow preventing portion 130 preventing the encapsulant 160 from flowing. The flow preventing portion 130 may be disposed adjacent to at least one side surface of the encapsulant 160. However, the flow preventing portion 130 may be disposed to surround the entirety of a side surface of the encapsulant 160.

As an example, the flow preventing portion 130 may include a flow preventing groove 132 disposed adjacent to the encapsulant 160 and a dam 134 disposed in parallel to the flow preventing groove 132. The dam 134 may be formed of an insulating material, such as the same material used for the insulating layer 121.

A width w1 of the flow preventing groove 132 may be 80 μm to 100 μm, and a depth d1 of the flow preventing groove 132 may be 20 μm to 30 μm. As an example, the width w1 of the flow preventing groove 132 may be 80 μm, and the depth d1 of the flow preventing groove 132 may be 20 μm.

Moreover, through experimentation, when the width w1 of the flow preventing groove 132 is smaller than 80 μm, the encapsulant 160 may flow over the flow preventing groove 132. When the width w1 of the flow preventing groove 132 is greater than 100 μm, as compared with the case in which the width w1 of the flow preventing groove 132 is equal to or less than 100 μm, the difference in the effect of preventing flow of the encapsulant 160 is insignificant. In such a case in which the width w1 is greater than 100 μm, it was confirmed that the width w1 is unnecessarily wide. Furthermore, if the width w1 of the flow preventing groove 132 is greater than 100 μm, a problem may occur, in which an overall size of the semiconductor package 100 is increased.

When the depth d1 of the flow preventing groove 132 is shallower than 20 μm, the encapsulant 160 may flow over the flow preventing groove 132. When the depth d1 of the flow preventing groove 132 is deeper than 30 μm, as compared with the case in which the depth d1 of the flow preventing groove 132 is equal to or less than 30 μm, the difference in the effect of preventing flow of the encapsulant 160 is insignificant. In a case in which the depth d1 is greater than 30 μm, it was confirmed that the depth d1 is unnecessarily deep. If the depth d1 of the flow preventing groove 132 is greater than 30 μm, a thickness of the substrate 120 becomes thinner in a portion having the flow preventing groove 132, so rigidity of the substrate 120 may be degraded.

The width w2 of the dam 134 may be 80 μm to 100 μm, while the thickness t1 of the dam 134 may be 20 μm to 30 μm. As an example, the width w2 of the dam 134 may be 80 μm, while the thickness t1 of the dam 134 may be 30 μm.

Through experimentation, when the width w2 of the dam 134 is smaller than 80 μm, the encapsulant 160 may flow over the dam 134. When the width w2 of the dam 134 is greater than 100 μm, as compared with the case in which the width w2 of the dam 134 is equal to or less than 100 μm, the difference in the effect of preventing flow of the encapsulant 160 is insignificant. In a case in which the width w2 is greater than 100 μm, it was confirmed that the width w2 is unnecessarily wide. If the width w2 of the dam 134 is greater than 100 μm, a problem may occur, in which an overall size of the semiconductor package 100 is increased.

When the thickness t1 of the dam 134 is thinner than 20 μm, the encapsulant 160 may flow over the dam 134. When the thickness t1 of the dam 134 is thicker than 30 μm, as compared with the case in which the thickness t1 of the dam 134 is equal to or less than 30 μm, the difference in the effect of preventing flow of the encapsulant 160 is insignificant. In a case in which the thickness t1 is greater than 30 μm, it was confirmed that the thickness t1 of the dam 134 is unnecessarily thick. If the thickness t1 of the dam 134 is thicker than 30 μm, when the electronic component 140 is mounted thereon, interference with the electronic component 140 may occur.

The flow preventing groove 132 may be spaced apart from the encapsulant 160 by 80 μm to 100 μm. When the flow preventing portion 130 is disposed closer than 80 μm to the encapsulant 160, it becomes difficult to inhibit the flow of the encapsulant 160. In a case in which the flow preventing portion 130 is disposed closer than 80 μm to the encapsulant 160, there may be a problem in which sizes of the flow preventing groove 132 and the dam 134 should be increased. Accordingly, a problem may occur, in which rigidity of the substrate 120 is degraded, and when an electronic component 140 is mounted, interference with the electronic component 140 may occur. That is, if the width w1 of the flow preventing groove 132 is wider and the depth d1 thereof is deeper, rigidity of the substrate 120 may be degraded. Moreover, if the width w2 of the dam 134 is wider and the thickness t1 thereof is thicker, when an electronic component 140 is mounted, interference with the electronic component 140 may occur. Furthermore, when the flow preventing portion 130 is disposed farther than 100 μm away from the encapsulant 160, there is no significant effect of inhibiting flow of the encapsulant 160, as compared with the case in which the flow preventing portion 130 is spaced apart from the encapsulant 160 by 100 μm. Furthermore, a problem may occur, in which an overall size of the semiconductor package 100 is increased. Thus, the flow preventing groove 132 is spaced apart from the encapsulant 160 by 80 μm to 100 μm.

Accordingly, the encapsulant 160 is prevented from flowing to contaminate an upper surface of the substrate 120, and a connection pad (not shown), provided on an upper surface of the substrate 120, is prevented from being covered by the encapsulant 160. In other words, due to the flow preventing portion 130, the encapsulant 160 is prevented from flowing over the flow preventing portion 130.

A plurality of electronic components 140 are mounted on an upper surface of the substrate 120. Moreover, some of the plurality of electronic components 140 are sealed by the encapsulant 160, while the rest of the plurality of electronic components 140 are not sealed by the encapsulant 160, and are exposed to an outside. The plurality of electronic components 140 may be composed of a semiconductor chip such as a radio frequency integrated chip (RFIC), a passive element, and the like. In other words, the electronic component 140 may be composed of a plurality of types of chips performing different functions.

The electronic component(s) 140 may be mounted on an upper surface of the substrate 120 by a solder ball, a conductive bump, a pin grid array, a lead grid array, a copper pillar, or the like.

The encapsulant 160 is disposed so that a portion of the plurality of electronic components 140 is embedded therein. The encapsulant 160 may have a predetermined strength to protect the electronic component(s) 140 from an external impact. As an example, the encapsulant 160 may be formed of an epoxy molding compound (EMC).

As described above, due to the flow preventing portion 130, contamination of the substrate 120, caused by flow of the encapsulant 160, is prevented from occurring.

Figure 2:
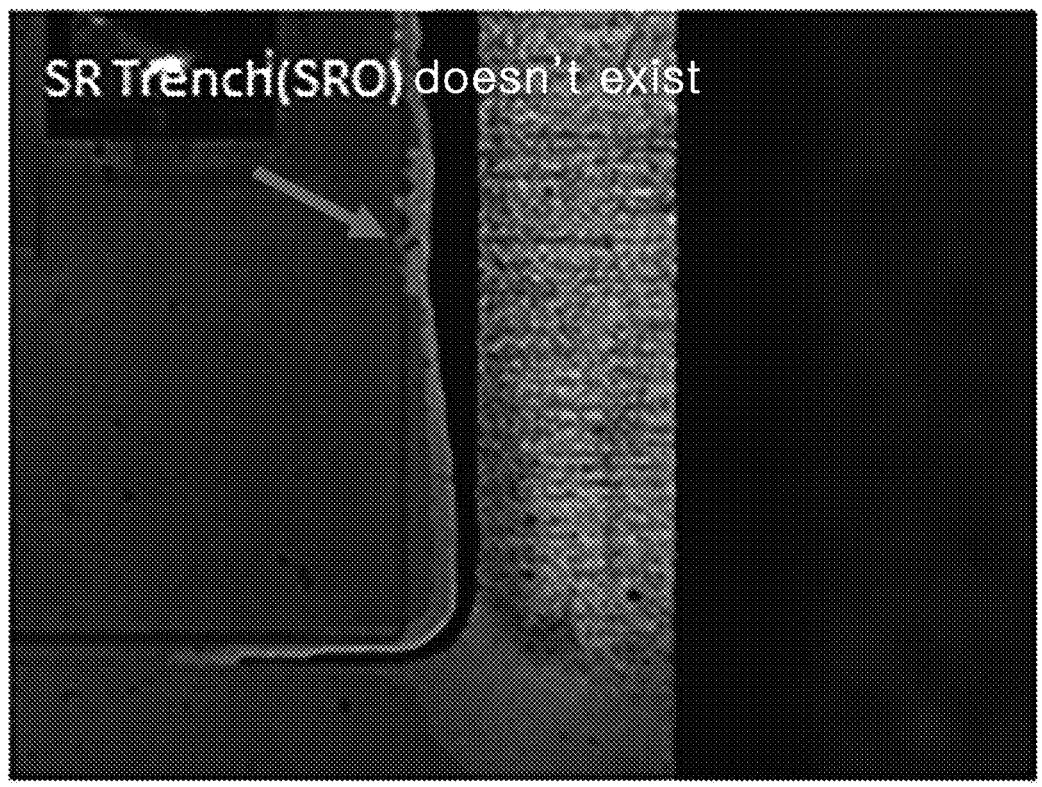
FIG. 2 is an image illustrating a substrate contaminated by an encapsulant.
Figure 3:
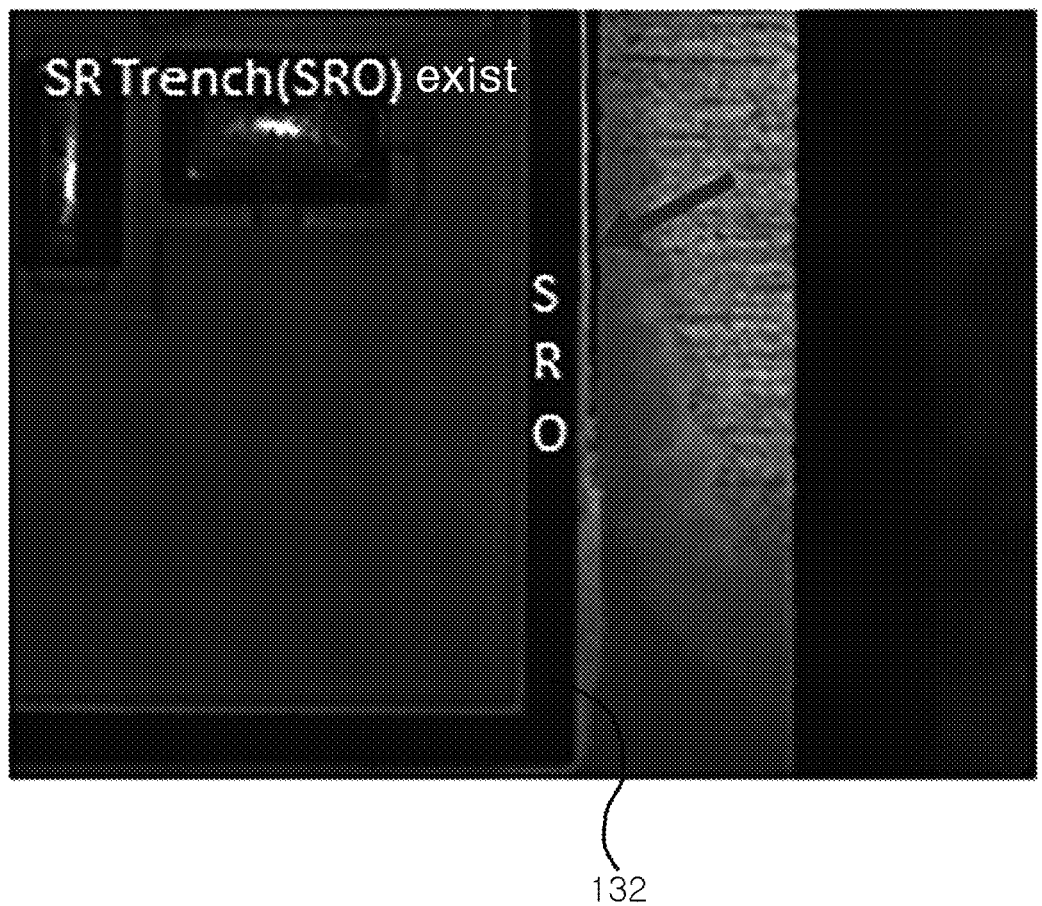
FIGS. 3 and 4 are images illustrating an encapsulant not flowing into a region in which an encapsulant is not formed due to a flow preventing portion.
Figure 4:
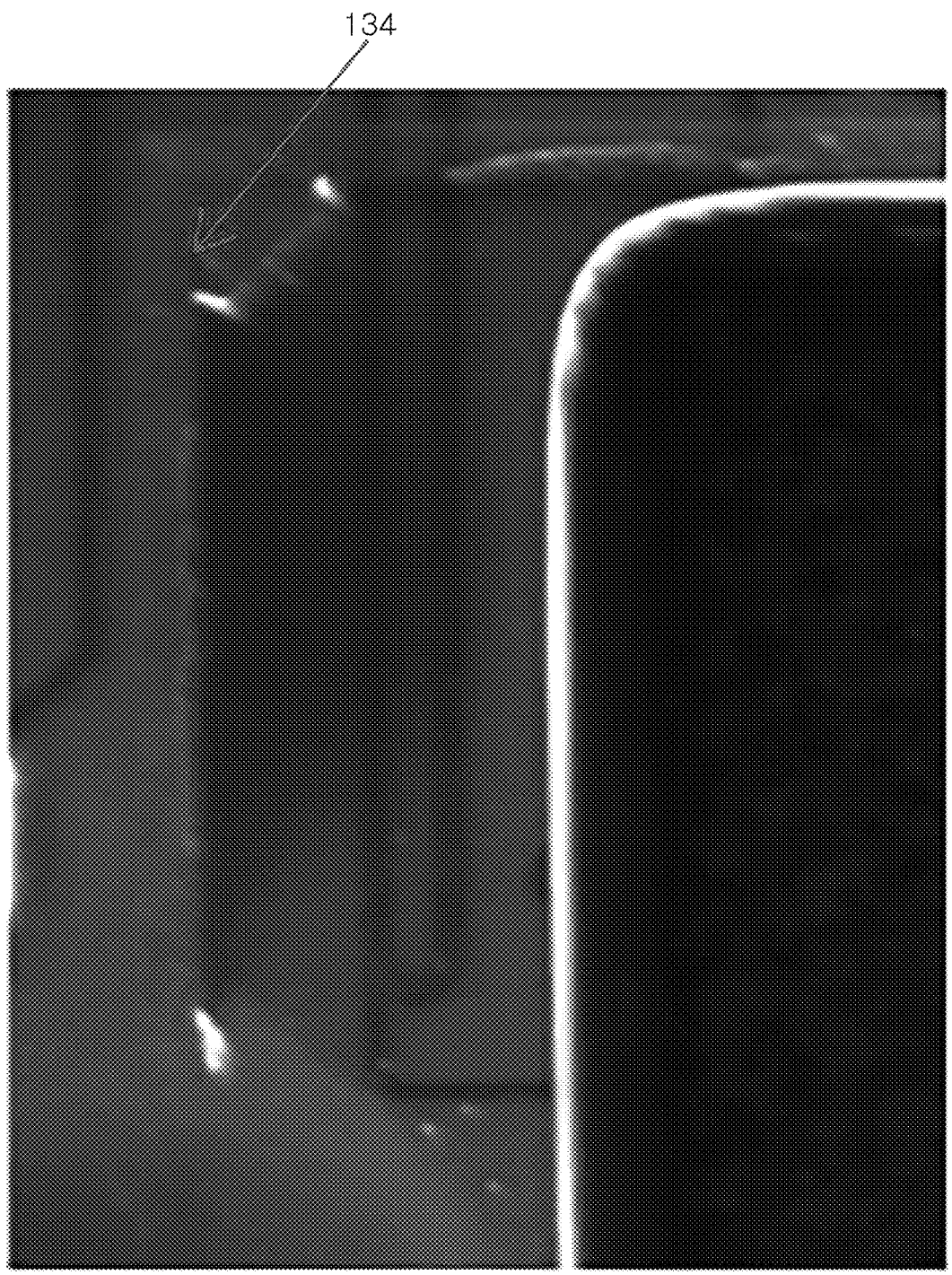

As illustrated in FIG. 2, when the flow preventing portion 130 is not provided, the encapsulant 160 flows into a region in which the encapsulant 160 is not formed, and thus a contamination occurs. However, as illustrated in FIG. 3, a flow preventing groove 132 is provided in a flow preventing portion 130. In this case, when the width w1 of the flow preventing groove 132 is 80 μm and the depth d1 of the flow preventing groove 132 is 20 μm, the encapsulant 160 does not flow into a region in which the encapsulant 160 is not formed (or not intended to be formed). In addition, as illustrated in FIG. 4, the dam 134 is provided in a flow preventing portion 130. In this case, when the width w2 of the dam 134 is 80 μm and the thickness t1 of the dam 134 is 30 μm, the encapsulant 160 does not flow into a region in which the encapsulant 160 is not formed (or not intended to be formed). Accordingly, it is possible to prevent contamination of the substrate 120 from occurring.

Figure 5:
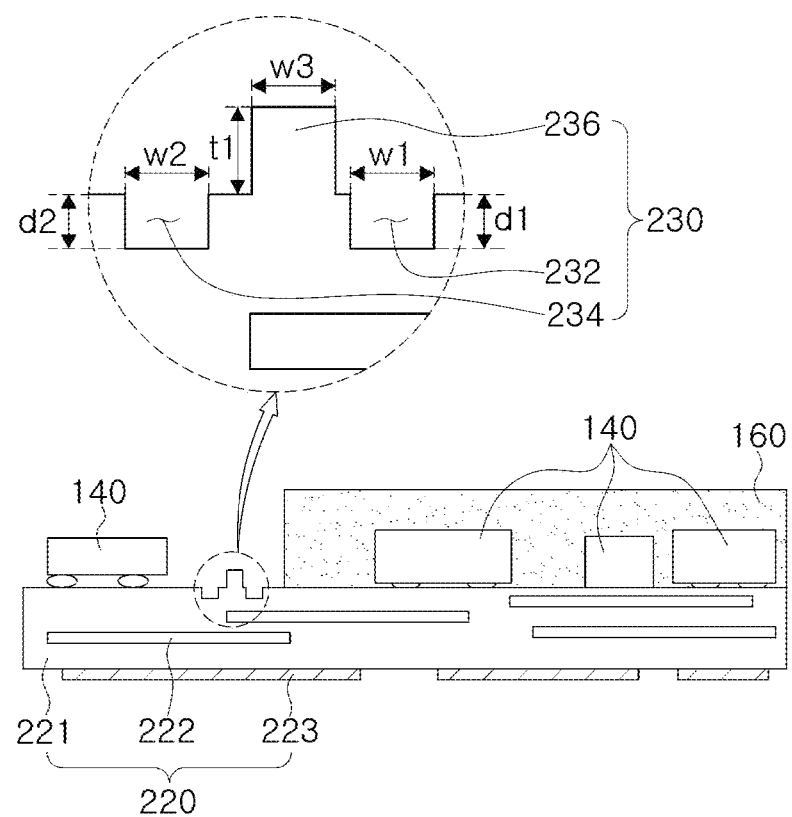
FIG. 5 is a schematic diagram illustrating a semiconductor package according to an example.

FIG. 5 is a schematic diagram illustrating a semiconductor package according to another example.

Referring to FIG. 5, a semiconductor package 200 may include a substrate 220, one or more electronic components 140, and an encapsulant 160.

Since the electronic component(s) 140 and the encapsulant 160 are substantially the same as the configuration provided in the semiconductor package 100 described previously, a detailed description thereof will be omitted.

The substrate 220 has a plate shape, and may include an insulating layer 221 and a wiring layer 222. For example, a material used for the insulating layer 221 may be a thermosetting resin such as an epoxy resin, a thermoplastic resin such as a polyimide resin, a resin in which the thermosetting resin or the thermoplastic resin is impregnated, together with an inorganic filler in a core material such as a glass fiber (or a glass cloth or a glass fabric), for example, an insulating material, such as prepreg, an Ajinomoto build-up film (ABF), FR-3, bismaleimide triazine (BT), or the like. A material used for the wiring layer 222 may be a conductive material such as copper (Cu), aluminum (Al), silver (Ag), tin (Sn), gold (Au), nickel (Ni), lead (Pb), titanium (Ti), or alloys thereof.

As an example, the substrate 220 may be one among a rigid printed circuit board, a flexible printed circuit board, and a rigid-flexible printed circuit board. The substrate 220 may be one of a single-layer printed circuit board and a multilayer printed circuit board.

The substrate 220 may be provided with a plurality of external terminals (not shown) connected to the wiring layer 222, and the external terminals may be provided as a solder ball, a conductive bump, a pin grid array, a lead grid array, a copper pillar, or a combination thereof.

A lower surface of the substrate 220 may be provided with an antenna 223. The antenna 223 may be an antenna for Wi-Fi, an antenna for 5G, or the like, and may be formed by patterning in a lower surface of the substrate 220. The antenna 223 may be provided as a plurality of antennas spaced apart from each other in the lower surface of the substrate 220, and the plurality of antennas 223 may be connected to each other.

An upper surface of the substrate 220, that is, a surface having the electronic component(s) 140 mounted thereon, may be provided with a flow preventing portion 230 preventing the encapsulant 160 from flowing. The flow preventing portion 230 may be disposed adjacent to at least one side surface of the encapsulant 160. However, the flow preventing portion 230 may be disposed to surround the entirety of a side surface of the encapsulant 160.

As an example, the flow preventing portion 230 may include a first flow preventing groove 232 disposed adjacent to the encapsulant 160, a second flow preventing groove 234 spaced apart from the first flow preventing groove 232, and a dam 236 disposed between the first and second flow preventing grooves 232 and 234.

The dam 236 may be formed of an insulating material, such as the same material as the insulating layer 221.

A width w1 of the first flow preventing groove 232 and a width w2 of the second flow preventing groove 234 may be 80 μm to 100 μm, and a depth d1 of the first flow preventing groove 232 and a depth d2 of the second flow preventing groove 234 may be 20 μm to 30 μm. As an example, the width w1 of the first flow preventing groove 232 and the width w2 of the second flow preventing groove 234 may be 80 μm, and the depth d1 of the first flow preventing groove 232 and the depth d2 of the second flow preventing groove 234 may be 20 μm.

Such a case is described as an example, in which the widths w1 and w2 as well as the depths d1 and d2 of the first and second flow preventing grooves 232 and 234 are the same, but the configuration is not limited thereto. Alternatively, the width w1 of the first flow preventing groove 232 may be wider than the width w2 of the second flow preventing groove 234, or the depth d1 of the first flow preventing groove 232 may be deeper than the depth d2 of the second flow preventing groove 234.

The width w3 of the dam 236 may be 80 μm to 100 μm, and the thickness t1 of the dam 236 may be 20 μm to 30 μm. As an example, the width w3 of the dam 236 may be 80 μm, and the thickness t1 of the dam 236 may be 30 μm.

The flow preventing portion 230, that is, the first flow preventing groove 232 may be spaced apart from the encapsulant 160 by 80 μm to 100 μm.

Accordingly, the encapsulant 160 is prevented from flowing to contaminate an upper surface of the substrate 220, and a connection pad (not shown), provided on an upper surface of the substrate 220, is prevented from being covered by the encapsulant 160. In other words, due to the flow preventing portion 230, the encapsulant 160 is prevented from flowing over the flow preventing portion 230.

Figure 6:
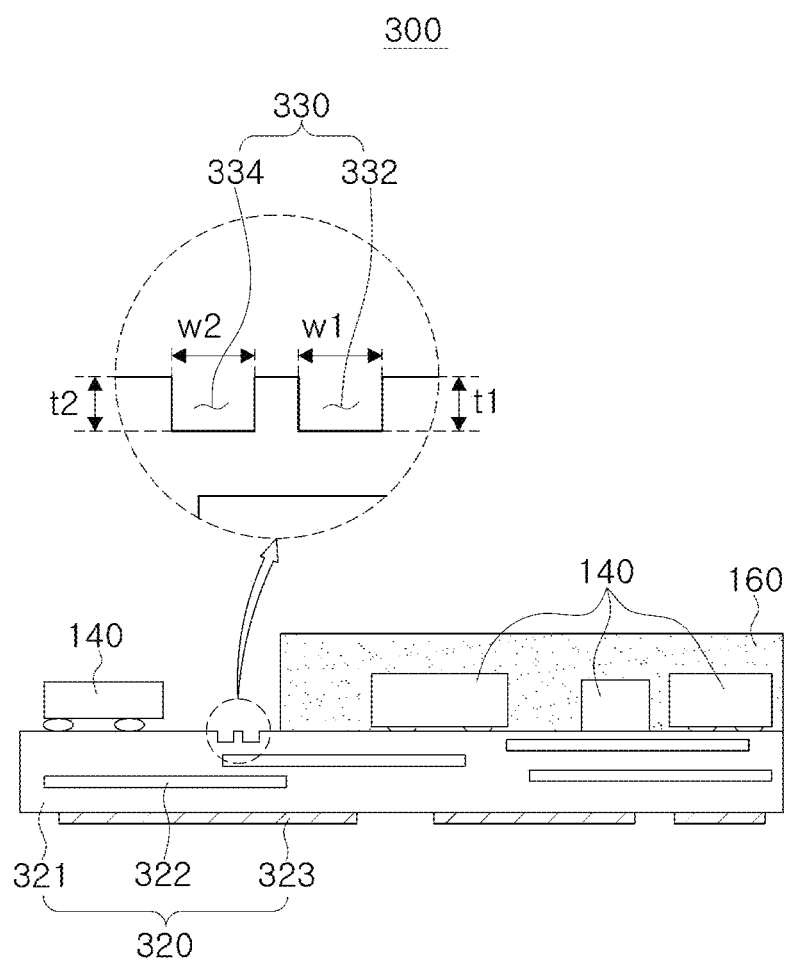
FIG. 6 is a schematic diagram illustrating a semiconductor package according to an example.

FIG. 6 is a schematic diagram illustrating a semiconductor package according to another example.

Referring to FIG. 6, a semiconductor package 300 may include a substrate 320, one or more electronic components 140, and an encapsulant 160.

Since the electronic component(s) 140 and the encapsulant 160 are substantially the same as the configuration provided in the semiconductor package 100 described previously, a detailed description thereof will be omitted.

The substrate 320 has a plate shape, and may include an insulating layer 321 and a wiring layer 322. A material used for the insulating layer 321 may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, an insulating material, such as prepreg, an Ajinomoto build-up film (ABF), FR-3, bismaleimide triazine (BT), or the like. A material used for the wiring layer 322 may be a conductive material such as copper (Cu), aluminum (Al), silver (Ag), tin (Sn), gold (Au), nickel (Ni), lead (Pb), titanium (Ti), or alloys thereof.

As an example, the substrate 320 may be one among a rigid printed circuit board, a flexible printed circuit board, and a rigid-flexible printed circuit board. The substrate 320 may be one of a single-layer printed circuit board and a multilayer printed circuit board.

Moreover, the substrate 320 may be provided with a plurality of external terminals (not shown) connected to the wiring layer 322, and the external terminals may be provided as a solder ball, a conductive bump, a pin grid array, a lead grid array, a copper pillar, or a combination thereof.

A lower surface of the substrate 320 may be provided with an antenna 323. The antenna 323 may be an antenna for Wi-Fi, an antenna for 5G, or the like, and may be formed by patterning in a lower surface of the substrate 320. The antenna 323 may be provided as a plurality of antennas 323 spaced apart from each other in the lower surface of the substrate 320, and the plurality of antennas 323 may be connected to each other.

An upper surface of the substrate 320, that is, a surface having the electronic component(s) 140 mounted thereon, may be provided with a flow preventing portion 330 preventing the encapsulant 160 from flowing. The flow preventing portion 330 may be disposed adjacent to at least one side surface of the encapsulant 160. However, the flow preventing portion 330 may be disposed to surround the entirety of a side surface of the encapsulant 160.

As an example, the flow preventing portion 330 may include a first flow preventing groove 332 disposed adjacent to the encapsulant 160 and a second flow preventing groove 334 spaced apart from the first flow preventing groove 332.

A width w1 of the first flow preventing groove 332 and a width w2 of the second flow preventing groove 334 may be 80 μm to 100 μm, and a depth d1 of the first flow preventing groove 332 and a depth d2 of the second flow preventing groove 334 may be 20 μm to 30 μm. As an example, the width w1 of the first flow preventing groove 332 and the width w2 of the second flow preventing groove 334 may be 80 μm, and the depth d1 of the first flow preventing groove 332 and the depth d2 of the second flow preventing groove 334 may be 20 μm.

Such a case is described as an example, in which the widths w1 and w2 as well as the depths d1 and d2 of the first and second flow preventing grooves 332 and 334 are the same, but the configuration is not limited thereto. Alternatively, the width w1 of the first flow preventing groove 332 may be wider than the width w2 of the second flow preventing groove 334, or the depth d1 of the first flow preventing groove 332 may be deeper than the depth d2 of the second flow preventing groove 334.

The flow preventing portion 330, that is, the first flow preventing groove 332 may be spaced apart from the encapsulant 160 by 80 μm to 100 μm.

Accordingly, the encapsulant 160 is prevented from flowing to contaminate an upper surface of the substrate 320, and a connection pad (not shown), provided on an upper surface of the substrate 320, is prevented from being covered by the encapsulant 160. In other words, due to the flow preventing portion 330, the encapsulant 160 is prevented from flowing over the flow preventing portion 330.

Figure 7:
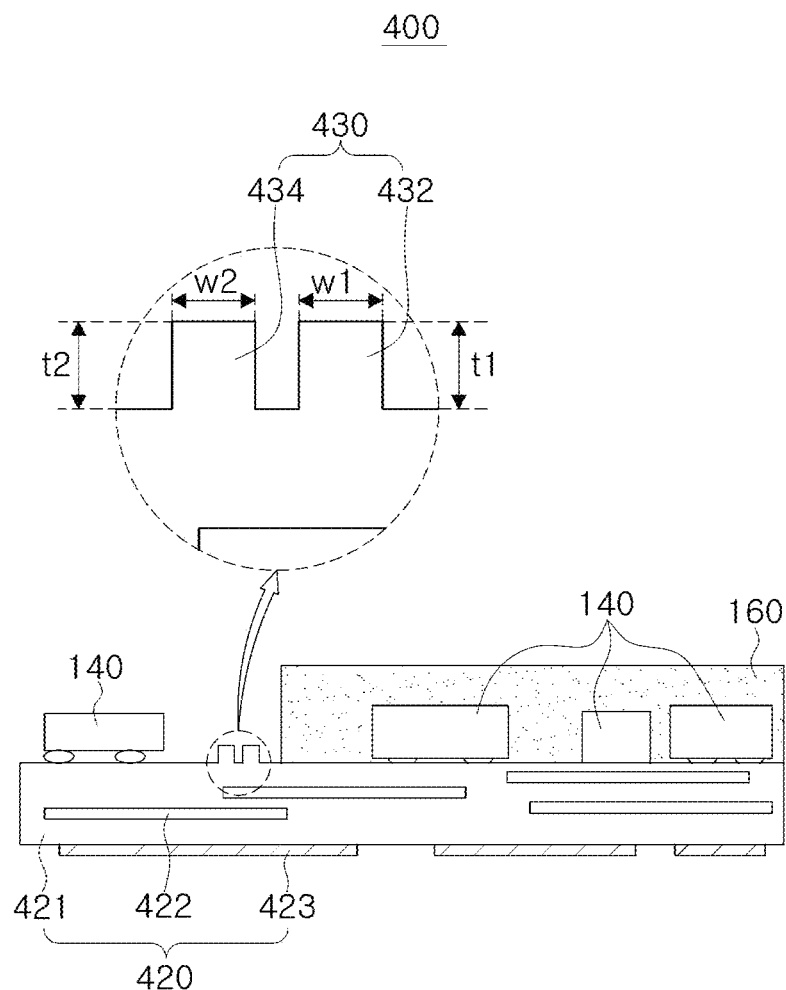
FIG. 7 is a schematic diagram illustrating a semiconductor package according to an example.

FIG. 7 is a schematic diagram illustrating a semiconductor package according to another example.

Referring to FIG. 7, a semiconductor package 400 may include a substrate 420, one or more electronic components 140, and an encapsulant 160.

Since the electronic component(s) 140 and the encapsulant 160 are substantially the same as the configuration provided in the semiconductor package 100 described previously, detailed description thereof will be omitted.

The substrate 420 has a plate shape, and may include an insulating layer 421 and a wiring layer 422. A material used for the insulating layer 421 may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, an insulating material, such as prepreg, an Ajinomoto build-up film (ABF), FR-3, bismaleimide triazine (BT), or the like. A material used for the wiring layer 422 may be a conductive material such as copper (Cu), aluminum (Al), silver (Ag), tin (Sn), gold (Au), nickel (Ni), lead (Pb), titanium (Ti), or alloys thereof.

As an example, the substrate 420 may be one among a rigid printed circuit board, a flexible printed circuit board, and a rigid-flexible printed circuit board. The substrate 420 may be one of a single-layer printed circuit board and a multilayer printed circuit board.

The substrate 420 may be provided with a plurality of external terminals (not shown) connected to the wiring layer 422, and the external terminals may be provided as a solder ball, a conductive bump, a pin grid array, a lead grid array, a copper pillar, or a combination thereof.

A lower surface of the substrate 420 may be provided with an antenna 423. The antenna 423 may be an antenna for Wi-Fi, an antenna for 5G, or the like, and may be formed by patterning in a lower surface of the substrate 420. The antenna 423 may be provided as a plurality of antennas 423 spaced apart from each other in the lower surface of the substrate 420, and the plurality of antennas 423 may be connected to each other.

An upper surface of the substrate 420, that is, a surface having the electronic component(s) 140 mounted thereon, may be provided with a flow preventing portion 430 preventing an encapsulant 160 from flowing. The flow preventing portion 430 may be disposed adjacent to at least one side surface of the encapsulant 160. However, the flow preventing portion 430 may be disposed to surround the entirety of a side surface of the encapsulant 160.

As an example, the flow preventing portion 430 may include a first dam 432 disposed adjacent to the encapsulant 160 and a second dam 434 spaced apart from the first dam 432. The first dam 432 and the second dam 434 may be formed of an insulating material that is the same as a material of the insulating layer 421 of the substrate 420.

A width w1 of the first dam 432 and a width w2 of the second dam 434 may be 80 μm to 100 μm, and a thickness t1 of the first dam 432 and a thickness t2 of the second dam 434 may be 20 μm to 30 μm. As an example, the width w1 of the first dam 432 and the width w2 of the second dam 434 may be 80 μm, and the thickness t1 of the first dam 432 and the thickness t2 of the second dam 434 may be 30 μm.

Such a case is described as an example, in which the widths w1 and w2 are the same, as well as the thicknesses t1 and t2 of the first and second dams 432 and 434 are the same, but the configuration is not limited thereto. Alternatively, the width w1 of the first dam 432 may be wider than the width w2 of the second dam 434, or the thickness t1 of the first dam 432 may be thicker than the thickness t2 of the second dam 434.

The flow preventing portion 430, that is, the first dam 432 may be spaced apart from the encapsulant 160 by 80 μm to 100 μm.

Accordingly, the encapsulant 160 is prevented from flowing to contaminate an upper surface of the substrate 420, and a connection pad (not shown), provided on an upper surface of the substrate 420, is prevented from being covered by the encapsulant 160. In other words, due to the flow preventing portion 430, the encapsulant 160 is prevented from flowing over the flow preventing portion 430.

Figure 8:
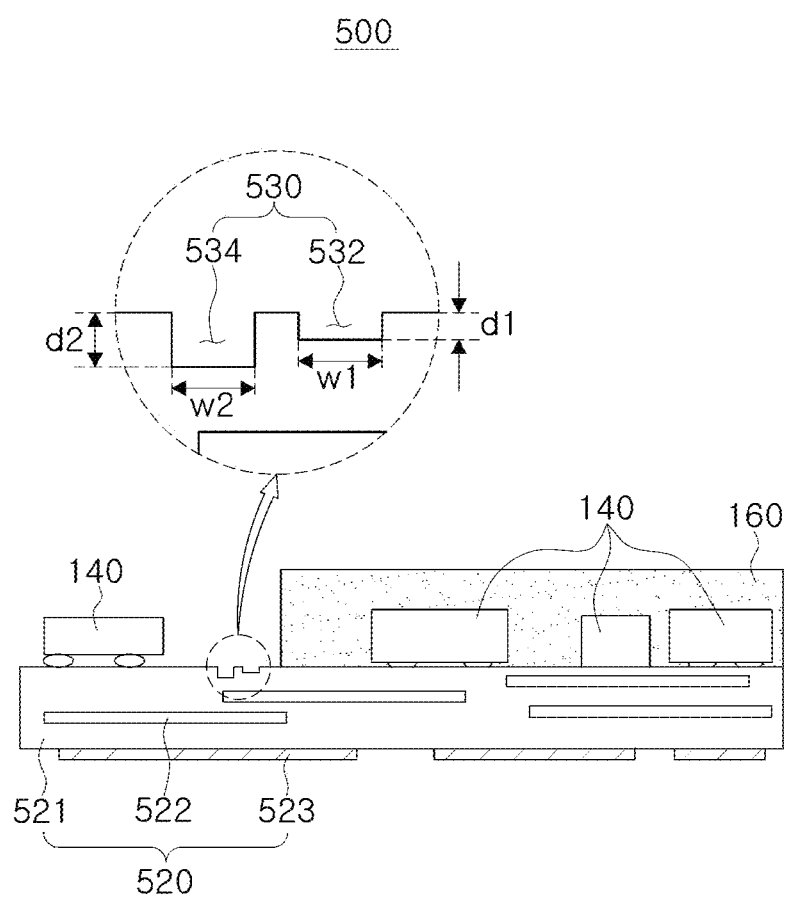
FIG. 8 is a schematic diagram illustrating a semiconductor package according to an example.

FIG. 8 is a schematic diagram illustrating a semiconductor package according to another example.

Referring to FIG. 8, a semiconductor package 500 may include a substrate 520, one or more electronic components 140, and an encapsulant 160.

Since the electronic component(s) 140 and the encapsulant 160 are substantially the same as the configuration provided in the semiconductor package 100 described previously, detailed description thereof will be omitted.

The substrate 520 has a plate shape, and may include an insulating layer 521 and a wiring layer 522. A material used for the insulating layer 521 may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, an insulating material, such as prepreg, an Ajinomoto build-up film (ABF), FR-3, bismaleimide triazine (BT), or the like. A material used for the wiring layer 522 may be a conductive material such as copper (Cu), aluminum (Al), silver (Ag), tin (Sn), gold (Au), nickel (Ni), lead (Pb), titanium (Ti), or alloys thereof.

As an example, the substrate 520 may be one among a rigid printed circuit board, a flexible printed circuit board, and a rigid-flexible printed circuit board. The substrate 520 may be one of a single-layer printed circuit board and a multilayer printed circuit board.

The substrate 520 may be provided with a plurality of external terminals (not shown) connected to the wiring layer 522, and the external terminals may be provided as a solder ball, a conductive bump, a pin grid array, a lead grid array, a copper pillar, or a combination thereof.

A lower surface of the substrate 520 may be provided with an antenna 523. The antenna 523 may be an antenna for Wi-Fi, an antenna for 5G, or the like, and may be formed by patterning in a lower surface of the substrate 520. Moreover, the antenna 523 may be provided as a plurality of antennas 523 spaced apart from each other in the lower surface of the substrate 520, and the plurality of antennas 523 may be connected to each other.

An upper surface of the substrate 520, that is, a surface having the electronic component(s) 140 mounted thereon, may be provided with a flow preventing portion 530 preventing the encapsulant 160 from flowing. The flow preventing portion 530 may be disposed adjacent to at least one side surface of the encapsulant 160. However, the flow preventing portion 530 may be disposed to surround the entirety of a side surface of the encapsulant 160.

As an example, the flow preventing portion 530 may include a first flow preventing groove 532 disposed adjacent to the encapsulant 160 and a second flow preventing groove 534 spaced apart from the first flow preventing groove 532.

A width w1 of the first flow preventing groove 532 and a width w2 of the second flow preventing groove 534 may be 80 μm to 100 μm. A depth d1 of the first flow preventing groove 532 and a depth d2 of the second flow preventing groove 534 may be different from each other. As an example, the depth d2 of the second flow preventing groove 534 may be deeper than the depth d1 of the first flow preventing groove 532.

Such a case is described as an example, in which the widths w1 and w2 of the first and second flow preventing grooves 532 and 534 are the same, but the configuration is not limited thereto. Alternatively, the width w1 of the first flow preventing groove 532 may be wider than the width w2 of the second flow preventing groove 534.

The flow preventing portion 530, that is, the first flow preventing groove 532 may be spaced apart from the encapsulant 160 by 80 μm to 100 μm.

Accordingly, the encapsulant 160 is prevented from flowing to contaminate an upper surface of the substrate 520, and a connection pad (not shown), provided on an upper surface of the substrate 520, is prevented from being covered by the encapsulant 160. In other words, due to the flow preventing portion 530, the encapsulant 160 is prevented from flowing over the flow preventing portion 530.

Figure 9:
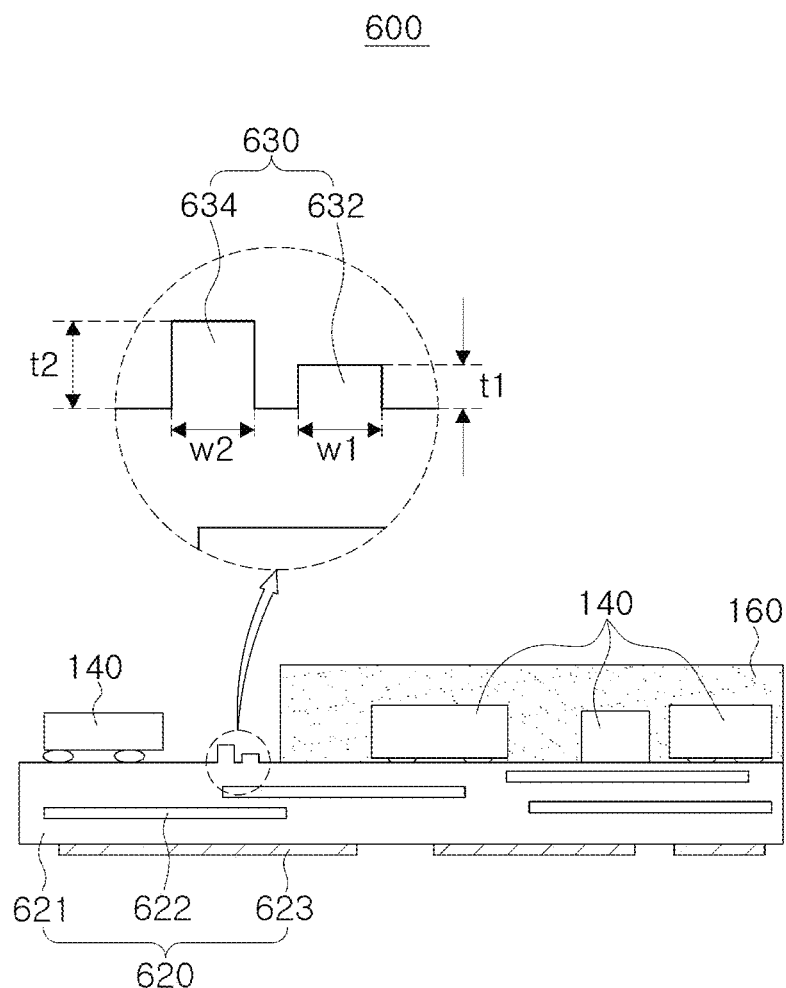
FIG. 9 is a schematic diagram illustrating a semiconductor package according to an example.

FIG. 9 is a schematic diagram illustrating a semiconductor package according to another example.

Referring to FIG. 9, a semiconductor package 600 may include a substrate 620, one or more electronic components 140, and an encapsulant 160.

Since the electronic component 140 and the encapsulant 160 are substantially the same as the configuration provided in the semiconductor package 100 described previously, detailed description thereof will be omitted.

The substrate 620 has a plate shape, and may include an insulating layer 621 and a wiring layer 622. A material used for the insulating layer 621 may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, an insulating material, such as prepreg, an Ajinomoto build-up film (ABF), FR-3, bismaleimide triazine (BT), or the like. A material used for the wiring layer 622 may be a conductive material such as copper (Cu), aluminum (Al), silver (Ag), tin (Sn), gold (Au), nickel (Ni), lead (Pb), titanium (Ti), or alloys thereof.

As an example, the substrate 620 may be one among a rigid printed circuit board, a flexible printed circuit board, and a rigid-flexible printed circuit board. The substrate 620 may be one of a single-layer printed circuit board and a multilayer printed circuit board.

The substrate 620 may be provided with a plurality of external terminals (not shown) connected to the wiring layer 622, and the external terminals may be provided as a solder ball, a conductive bump, a pin grid array, a lead grid array, a copper pillar, or a combination thereof.

A lower surface of the substrate 620 may be provided with an antenna 623. The antenna 623 may be an antenna for Wi-Fi, an antenna for 5G, or the like, and may be formed by patterning in a lower surface of the substrate 620. The antenna 623 may be provided as a plurality of antennas 623 spaced apart from each other in the lower surface of the substrate 620, and the plurality of antennas 623 may be connected to each other.

An upper surface of the substrate 620, that is, a surface having the electronic component(s) 140 mounted thereon, may be provided with a flow preventing portion 630 preventing the encapsulant 160 from flowing. The flow preventing portion 630 may be disposed adjacent to at least one side surface of the encapsulant 160. However, the flow preventing portion 630 may be disposed to surround the entirety of a side surface of the encapsulant 160.

As an example, the flow preventing portion 630 may include a first dam 632 disposed adjacent to the encapsulant 160 and a second dam 634 spaced apart from the first dam 632. The first and second dams 632 and 634 may be formed of an insulating material that is the same material as the insulating layer 621 of the substrate 620.

A width w1 of the first dam 632 and a width w2 of the second dam 634 may be 80 μm to 100 μm. A thickness t2 of the second dam 634 may be thicker than a thickness t1 of the first dam 632. As an example, the width w1 of the first dam 632 and the width w2 of the second dam 634 may be 80 μm.

Such a case is described as an example, in which the widths w1 and w2 of the first and second dams 632 and 634 are the same, but the configuration is not limited thereto. Alternatively, the width w1 of the first dam 532 may be wider than the width w2 of the second dam 534.

The flow preventing portion 630, that is, the first dam 632, may be spaced apart from the encapsulant 160 by 80 μm to 100 μm.

Accordingly, the encapsulant 160 is prevented from flowing to contaminate an upper surface of the substrate 620, and a connection pad (not shown), provided on an upper surface of the substrate 620, is prevented from being covered by the encapsulant 160. In other words, due to the flow preventing portion 630, the encapsulant 160 is prevented from flowing over the flow preventing portion 630.

As set forth above, according to the various examples, contamination of a substrate, caused by an encapsulant, may be prevented from occurring, and the encapsulant may be prevented from covering a connection pad provided in the substrate.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
   a substrate;
   a plurality of electronic components mounted on a first surface of the substrate; and
   an encapsulant disposed on the first surface of the substrate so that at least one of the plurality of electronic components is embedded in the encapsulant;
   wherein the substrate comprises a flow preventing portion including at least one flow preventing groove disposed in the first surface and adjacent to the encapsulant and/or at least one dam disposed on the first surface and adjacent to the encapsulant, and
   wherein the at least one flow preventing groove or the at least one dam is spaced apart from the encapsulant by 80 μm to 100 μm.

2. The semiconductor package of claim 1, wherein a width of the at least one flow preventing groove is 80 μm to 100 μm, and a depth of the at least one flow preventing groove is 20 μm to 30 μm, and
   a width of the at least one dam is 80 μm to 100 μm, and a height of the at least one dam is 20 μm to 30 μm.

3. The semiconductor package of claim 1, wherein the flow preventing portion comprises a flow preventing groove disposed adjacent to the encapsulant and a dam spaced apart from and disposed in parallel to the flow preventing groove.

4. The semiconductor package of claim 1, wherein the flow preventing portion comprises a first flow preventing groove disposed adjacent to the encapsulant, a second flow preventing groove spaced apart from the first flow preventing groove, and a dam disposed between the first flow preventing groove and the second flow preventing groove.

5. The semiconductor package of claim 1, wherein the flow preventing portion comprises a first flow preventing groove disposed adjacent to the encapsulant and a second flow preventing groove spaced apart from and disposed in parallel to the first flow preventing groove.

6. The semiconductor package of claim 5, wherein a depth of the first flow preventing groove is equal to a depth of the second flow preventing groove.

7. The semiconductor package of claim 5, wherein a depth of the second flow preventing groove is larger than a depth of the first flow preventing groove.

8. The semiconductor package of claim 1, wherein the flow preventing portion comprises a first dam disposed adjacent to the encapsulant and a second dam spaced apart from and disposed in parallel to the first dam.

9. The semiconductor package of claim 8, wherein a height of the first dam is the same as a height of the second dam.

10. The semiconductor package of claim 8, wherein a height of the second dam is greater than a height of the first dam.

11. The semiconductor package of claim 1, further comprising an antenna disposed on a second surface of the substrate opposite to the first surface.

12. The semiconductor package of claim 11, wherein the antenna is configured for Wi-Fi communication or 5G communication.

13. The semiconductor package of claim 1, wherein the at least one dam comprises an insulating material.

14. A semiconductor package, comprising:
    a substrate;

a plurality of electronic components mounted on a first surface of the substrate;
an encapsulant disposed on the first surface of the substrate so that at least one of the plurality of electronic components is embedded in the encapsulant,
wherein the substrate comprises a flow preventing portion disposed adjacent to the encapsulant,
wherein the flow preventing portion comprises a flow preventing groove disposed in the first surface of the substrate and a dam disposed on the first surface of the substrate, and
wherein the flow preventing portion is spaced apart from the encapsulant by 80 µm to 100 µm, and
wherein a width of the flow preventing groove is 80 µm to 100 µm, and a depth of the flow preventing groove is 20 µm to 30 µm.

15. The semiconductor package of claim 14, wherein a width of the dam is 80 µm to 100 µm, and a height of the dam is 20 µm to 30 µm.

16. A semiconductor package, comprising:
a substrate;
an encapsulant disposed on a first surface of the substrate;
a first electronic component mounted on the first surface of the substrate and embedded in the encapsulant;
a second electronic component mounted on the first surface of the substrate outside of the encapsulant;
a first flow preventing element disposed along the first surface of the substrate between the encapsulant and the second electronic component; and
a second flow preventing element disposed along the first surface of the substrate between the first flow preventing element and the second electronic component,
wherein the first flow preventing element is a groove disposed in the first surface of the substrate, and the groove is spaced apart from the encapsulant by 80 µm to 100 µm.

17. The semiconductor package of claim 16, wherein the second flow preventing element is a dam disposed on the first surface of the substrate.

18. A semiconductor package, comprising:
a substrate;
an encapsulant disposed on a first surface of the substrate;
a first electronic component mounted on the first surface of the substrate and embedded in the encapsulant;
a second electronic component mounted on the first surface of the substrate outside of the encapsulant;
a first flow preventing element disposed along the first surface of the substrate between the encapsulant and the second electronic component; and
a second flow preventing element disposed along the first surface of the substrate between the first flow preventing element and the second electronic component,
wherein the first flow preventing element is a first groove disposed in the first surface of the substrate,
the second flow preventing element is a second groove disposed in the first surface of the substrate, and
the first groove is spaced apart from the encapsulant by 80 µm to 100 µm.

19. A semiconductor package, comprising:
a substrate;
an encapsulant disposed on a first surface of the substrate;
a first electronic component mounted on the first surface of the substrate and embedded in the encapsulant;
a second electronic component mounted on the first surface of the substrate outside of the encapsulant;
a first flow preventing element disposed along the first surface of the substrate between the encapsulant and the second electronic component; and
a second flow preventing element disposed along the first surface of the substrate between the first flow preventing element and the second electronic component,
wherein the first flow preventing element is a first dam disposed on the first surface of the substrate,
the second flow preventing element is a second dam disposed on the first surface of the substrate, and
the first dam is spaced apart from the encapsulant by 80 µm to 100 µm.

* * * * *